United States Patent [19]

Leuthold

[11] 4,424,457

[45] Jan. 3, 1984

[54] VOLTAGE LEVEL DETECTING CIRCUIT

[75] Inventor: Oskar Leuthold, Marin, Switzerland

[73] Assignee: Ebauches Electroniques, Switzerland

[21] Appl. No.: 265,594

[22] Filed: May 20, 1981

[30] Foreign Application Priority Data

May 28, 1980 [CH] Switzerland .................. 4128/80

[51] Int. Cl.³ .................. H03K 5/24; H03K 5/153
[52] U.S. Cl. .................. 307/350; 307/296 R;
  307/355; 307/360; 307/363
[58] Field of Search .................. 307/296 R, 350, 355,
  307/356, 360, 364, 362, 363; 328/147

[56] References Cited

U.S. PATENT DOCUMENTS 3,676,702  7/1972  McGrogan, Jr. .................. 307/355
4,028,558  6/1977  Heller et al. .................. 307/355
4,191,900  3/1980  Redfern et al. .................. 307/355

Primary Examiner—John Zazworsky
Attorney, Agent, or Firm—Allegretti, Newitt, Witcoff & McAndrews, Ltd.

[57] ABSTRACT

A voltage level detector circuit, which enables an input voltage to be compared with a predetermined stable reference level, defined on the basis of the sum of a first value of the direct voltage across the terminals of a diode and of the product of the difference between this first value and a second value of the voltage across the terminals of the diode by a predetermined coefficient, comprises substantially identical bipolar transistors (1, 2), connected as diodes, in series with current sources (3, 4) for generating voltages representative of these first and second values, a capacitive calculating circuit (5–8) which produces a signal representative of the algebraic value of the difference between the input voltage and the reference level and an amplifier (9) for bringing this signal to a logic level.

17 Claims, 6 Drawing Figures

VOLTAGE LEVEL DETECTING CIRCUIT

BACKGROUND OF THE INVENTION

The invention relates to a voltage level detecting circuit.

Such circuits, which enable a voltage to be compared with a reference level, have numerous applications, particularly in the field of analogue-digital conversion. They can also be used for continuously or intermittently checking whether a voltage is being maintained at a substantially constant value or is deviating from this value. This is the case, for example, in electronic watches where such circuits can serve for indicating when the batteries with which they are provided are approaching the end of their life, the end of the life of a battery being indicated by a sudden fall in the voltage at its terminals, which voltage had previously been maintained at a substantially constant value.

On the other hand, it is desirable that these detecting circuits, forming part of complex electronic assemblies which are increasingly often arranged according to CMOS technology, should be designed in such a manner that they can be completely integrated according to this technology.

Moreover, the low energy consumption and high degree of integration of CMOS circuits constitute vital advantages in certain applications, such as that of horology.

The main difficulty involved in designing a CMOS technology voltage level detecting circuit is in the production of a stable reference voltage. This reference voltage must be as constant as possible and in particular it must not be dependent on the temperature. Nor should it be affected by possible fluctuations in the supply voltage of the circuit which produces it, particularly when this supply is in fact the voltage to be compared or a voltage which is directly dependent thereon.

With CMOS technology it is possible to produce a reference voltage from the threshold voltage of a field-effect transistor and to alter the value of this voltage by adjusting various parameters on which it depends during the production of the transistor, for example, by adjusting the thickness of the layer of silicon dioxide between the gate and the channel.

The technological means that are available at the present time enable circuits with at least one transistor to be produced which utilize this threshold voltage to produce a reference voltage having a very low temperature coefficient, of the order of 0.5 mV per degree. Unfortunately, however, the values of the threshold voltages vary widely from one circuit to another. It is accordingly necessary to provide additional elements, usually adjustable resistances, in order to compensate for these variations. Since adjustable resistances cannot be integrated with simple technology, their use increases the cost of the circuit.

Circuits are also known which utilize, for the production of a stable reference voltage, the difference between the threshold voltages of two transistors which have the same type of conductivity. For example, an implanted transistor and a nonimplanted transistor can be associated with each other. The main disadvantage of these circuits is that they generally give rise to an increase in the number of operations required to produce the integrating circuit, and hence to a higher cost of production. In addition, the number of important parameters which are encountered in the course of production enable the desired result to be only rarely achieved.

Another type of circuit which produces a reference voltage makes use of the fact that the voltage at the terminals of a diode that is forward biased by a constant current increases linearly with decreasing temperature and tends toward the bandgap value $V_{BG}$, which is forbidden band width for the semi-conductor constituting the diode, when the absolute temperature is extrapolated to zero. The value $V_{BG}$ is equal to 1.205 volts in the case of silicon. It is therefore possible to obtain a voltage which is independent of the temperature by adding to the voltage at the terminals of the diode, which is usually constituted by the base-emitter junction of a bipolar transistor, a voltage proportional to the temperature. Such a circuit, which is described inter alia in the article in the periodical IEEE Journal of Solid State Circuits, Vol. SC 14, pages 153 to 157, June, 1979, entitled "A Low-Voltage CMOS Bandgap Reference", has disadvantages in cases where it is necessary to obtain a precise reference voltage. This circuit utilizes, for the purpose of producing a voltage proportional to the absolute temperature, pairs of field-effect transistors. It is known that even matched transistors can have threshold voltages which differ by as much as 50 mV. This produces, at the output of the source of the voltage which is proportional to the temperature, changes which may be as great as or may even exceed a hundred millivolts. Moreover, as the threshold voltages of the transistors vary, these changes vary likewise. To this must be added the change, compared with the ideal characteristic, of the bipolar transistor which produces the diode voltage and that of the differential amplifier which serves for comparing the voltage which is proportional to the temperature with the difference between the supply voltage and a voltage which is a function of the diode voltage.

It is therefore difficult to produce large numbers of such circuits so that they are economic and reproducible. The addition of adjusting means would deprive this solution of the advantage which it has over the previously mentioned one in which the threshold voltage of a transistor is used for producing a reference voltage.

BRIEF SUMMARY OF THE INVENTION

One of the objects of the invention is accordingly to provide a voltage level detecting circuit which enables a voltage to be compared with a reference voltage, without making use of the abovementioned means.

In addition, circuits are known, in bipolar technology, which likewise make use of the band-gap value, but nevertheless operate very satisfactorily. The reference voltage is obtained by adding to the diode voltage, which has a negative temperature coefficient, a voltage which has a positive temperature coefficient corresponding to a multiple of the difference between two other diode voltages.

But, since, in simple CMOS technology, bipolar transistors have their collector connected to the substrate of the integrating circuit which is raised to the highest possible positive potential, such circuits cannot be produced according to this technology.

Another object of the invention is, therefore, to provide a circuit which also makes use of this principle but can be wholly integrated in CMOS technology without necessitating more operations than are customarily per-formed in order to produce an integrating circuit of this type.

The objects are achieved according to one aspect of the invention by a circuit for enabling an input voltage to be compared with a stable reference level, which circuit comprises means for generating a first, a second and a third voltage, the values of which are functions of a first, a second and a third value respectively of the direct voltage across the terminals of a diode; a capacitive calculating circuit for producing from the input voltage and from the first, second and third voltages a difference signal representative of the algebraic value of the difference between the input voltage and the reference level defined on the basis of the sum of the first value of the direct voltage across the terminals of the diode and the product of the difference between the second and third values of the direct voltage across the terminals of the diode by a predetermined coefficient; and amplifying means for bringing the difference signal to a logic level.

According to another aspect of the invention, the second or third value of the voltage at the terminals of the diode is selected so as to be equal to the first and no more than two voltages are generated which are functions of the two values respectively of the diode voltage.

According to a preferred embodiment of the invention, the detecting circuit comprises means for adjusting the reference level.

BRIEF DESCRIPTION OF THE DRAWINGS

The invention will now be described in more detail, by way of example, with reference to the accompanying drawings, in which.

DETAILED DESCRIPTION OF THE PREFERRED EMBODIMENTS

Figure 1:
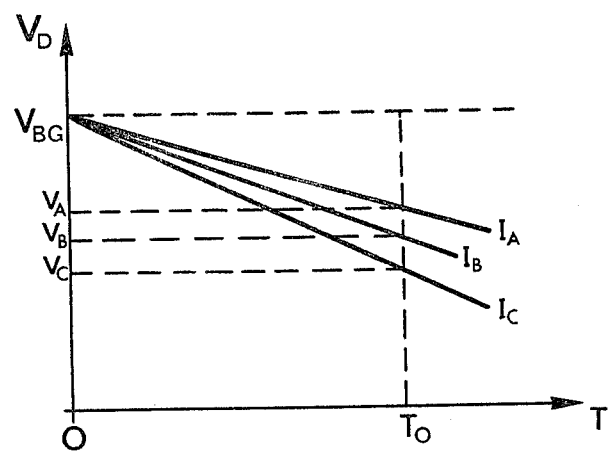
FIG. 1 is a graphical diagram for enabling the general principle of operation of the detecting circuit according to the invention to be explained.

In order to explain the general principle of operation of the circuit according to the invention, the diagram of FIG. 1 will first be considered.

This diagram illustrates the development, as a function of the absolute temperature T, of the voltage $V_D$ across the terminals of a diode constituted by the base-emitter junction of a bipolar transistor for three values $I_A$, $I_B$, and $I_C$ of the current which flows across it. As has previously been stated, this voltage increases linearly as the temperature is reduced and approaches the bandgap value $V_{BG}$ as the temperature T approaches zero. This voltage is substantially equal to $$V_D = V_{BG} - \frac{kT}{e} \text{Log} \frac{I_o}{I}$$

where k is the Boltzmann's constant, e the electron charge and $I_o$ a value which depends mainly on the surface of the device and on the equivalent concentrations of conduction and valence states of the doped material.

The value $I_o$ is very much higher than that of the current I which traverses the diode; although it depends on the technology of manufacture of the transistor and weakly on the temperature, this value will be considered here as being constant.

If two different currents $I_B$ and $I_C$ are caused to flow successively through one and the same diode or through two identical diodes, at one and the same temperature $T_o$, the difference between the voltages which appear across its or their terminals will be equal to $$V_B - V_C = \frac{kT_o}{e} \text{Log} \frac{I_B}{I_C}$$

This difference presents a positive temperature coefficient.

If a voltage proportional to this difference is added to the voltage $V_A$, corresponding to the current $I_A$, then for the same temperature $T_o$ there is obtained:

$$V_A + \alpha(V_B - V_C) = V_{BG} - \frac{kT_o}{e}\left(\text{Log}\frac{I_o}{I_A} - \alpha \text{Log}\frac{I_B}{I_C}\right)$$

This quantity $V_A + \alpha(V_B - V_C)$ can be made independent of the temperature by selecting for $\alpha$ a value such that:

$$\text{Log}\frac{I_o}{I_A} - \alpha \text{Log}\frac{I_B}{I_C} = 0$$

Hence $$V_A + \alpha(V_B - V_C) = V_{BG}$$

Comparing a voltage V with the bandgap value $V_{BG}$ consequently amounts to comparing this voltage with the voltage $V_A + \alpha(V_B - V_C)$. It is for example possible to produce signals representative of the quantities $V - V_A$ and $\alpha(V_C - V_B)$ and to add these signals together algebraically. In addition, the voltage $V_A$ may be selected so as to be equal to the voltage $V_B$ or to the voltage $V_C$. These possibilities are used in embodiments of the circuit of the invention which will now be described.

Figure 2:
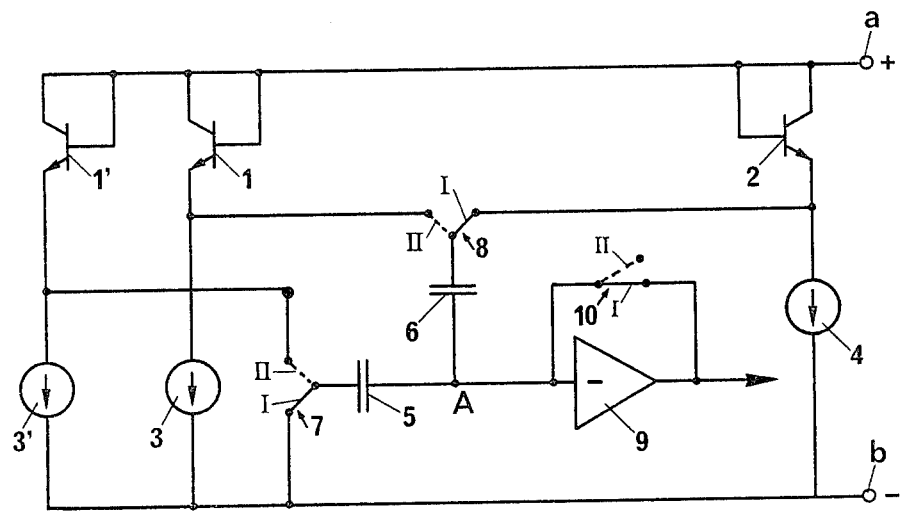
FIG. 2 is a diagram of an illustrative embodiment of the detecting circuit according to the invention which makes use of three diode voltages.

FIG. 2 illustrates a first embodiment of the detector circuit according to the invention in which the comparison of an input voltage V with the bandgap value $V_{BG}$ is made using three diode voltages of different values.

The circuit comprises three bipolar transistors 1, 1', 2 of NPN type connected up as diodes, i.e. each having its base connected to its collector, and having substantially identical characteristics.

These bipolar transistors can easily be produced by CMOS techniques, using as the emitter the $n^+$ diffusion which is normally used for the source and the drain of an N-channel transistor, as the base the $p^-$ type region and as collector the $n^-$ type substrate.

The collector of each of the transistors is connected to one a of the terminals a and b of the circuit, between which terminals is applied the voltage V.

The current $I_1$ or $I'_1$ flowing through the base-emitter junction of each of the bipolar transistors 1, 1' is maintained constant by means of a current source 3 or 3' connected between its emitter and the terminal b of the circuit. In the same way, the current $I_2$ through the base-emitter junction of the transistor 2 is determined by a current source 4 so that $I_2$ is less than $I_1$ and $I_{1'}$.

The circuit of FIG. 2 comprises in addition two capacitors 5 and 6. One of the plates of the capacitor 5 is connected selectively by means of a change-over switch 7 either with the terminal b of the circuit or with the emitter of the transistor 1'. Moreover, a further change-over switch 8 enables one of the plates of the capacitor 6 to be connected selectively either to the emitter of the transistor 2 or to that of the transistor 1. Each capacitor 5, 6 forms with the change-over switch 7, 8 which is associated with it a substractive capacitive circuit. The respective capacitances C and C' of the capacitors 5 and 6 are such that the ratio C'/C is very nearly equal to the value of the multiplicative coefficient $\alpha$ which reduces the following quantity to zero $$\text{Log}\frac{I_o}{I_{1'}} - \alpha \, \text{Log}\frac{I_1}{I_2}$$

The other plates of the capacitors 5 and 6, which are connected together, are connected to the inverting input of an amplifier 9 having a very high gain. A change-over switch 10 enables the output of the amplifier 9 to be either connected or not connected to its input.

In a first phase, the three change-over switches 7, 8, 10 are located in the position I shown in full lines in FIG. 2. The amplifier 9, which is then subjected to a direct feedback, is self-biased to a stable operating point, its input voltage $V_E$ then being equal to its output voltage and its gain then having a maximum value.

At the same time, the capacitors 5 and 6 are charged at the voltages $-V_E$ and $(V-V_{BE2})-V_E$ respectively, $V_{BE2}$ indicating the base-emitter voltage of the transistor 2.

When the three change-over switches 7, 8, 10 are changed-over from their position I to their position II, which last-mentioned position is indicated in broken lines in FIG. 2, the capacitor 5 discharges to the input connection A of the amplifier, which is left floating, an electrical charge equal to $C(V'_{BE1}-V)$, in which $V'_{BE1}$ represents the base-emitter voltage of the transistor 1', while the capacitor 6 discharges a charge equal to $\alpha C(V'_{BE1}-V_{BE2})$, which is of opposite sign to that discharged by the capacitor 5, $V_{BE1}$ being the base-emitter voltage of the transistor 1. If the algebraic sum of these charges is nil, i.e., if the voltage V is numerically equal to the band-gap value $V_{BG}$, no signal will appear at the input of the amplifier 9. If, however, on the contrary the voltage V is numerically different from the value $V_{BG}$, a voltage change will appear at the input of the amplifier, which voltage change is a function of the difference $V-(V'_{BE1}+\alpha(V_{BE1}-V_{BE2}))$ and the polarity of which is representative of the sign of this difference. This signal is amplified and inverted by the amplifier 9 which emits an output signal of much greater amplitude than that of the signal applied at its input. This output signal of the amplifier 9, which is of logical level, can be used for example as the control signal of a flip-flop (not shown) connected to the amplifier through a buffer circuit which memorizes the state of the output of this amplifier.

It is possible, with the aid of the circuit which has just been described, to detect extremely small voltage differences, down to 1 mV. Furthermore, the circuit operates very rapidly. The time required for the comparison is of the order of 3 ms and it is devoted mainly to the preparatory phase of charging the capacitors and biasing the amplifier, the calculating and comparison phase being extremely rapid and occupying only a few microseconds.

On the other hand, it is easy, with MOS technology to obtain for the capacitors very precise ratios of their capacitances. In addition, it can be confirmed from the preceding description that the amplifier 9 in fact serves for amplifying the signal that appears at the point A only to an extent sufficient to enable its output signal to cause another circuit to operate correctly. It is accordingly sufficient to use as the amplifier a simple inverter formed of two complementary transistors mounted so as to have a common source and with their drains interconnected.

Figure 3:
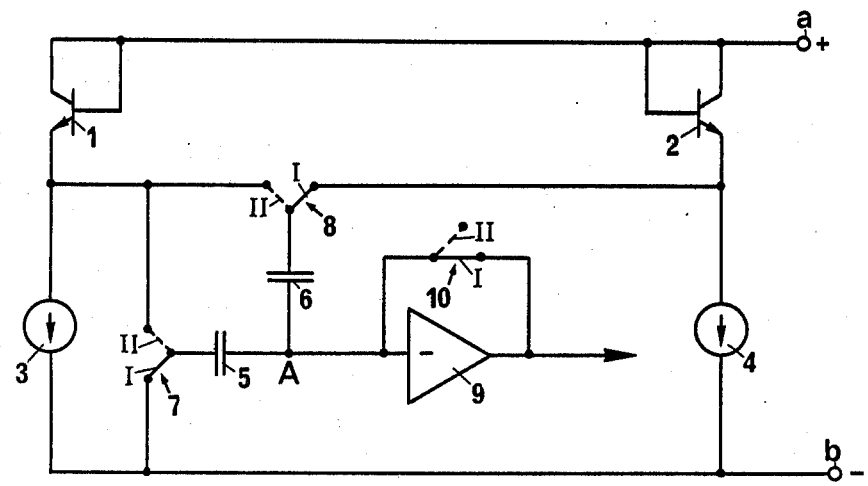
FIG. 3 is a diagram of another illustrative embodiment of the detecting circuit which makes use of only two diode voltages.

As has been indicated in the explanations of the principles of operation of the detection circuit, it is not necessary to produce three different diode voltages. It is possible to dispense with one bipolar transistor and one source of current by using as the first diode voltage $V_{BE1}'$ one of the two others. FIG. 3 illustrates an embodiment of a detection circuit corresponding to the case where the voltage $V_{BE1}'$ is selected so as to be equal to the voltage $V_{BE1}$. The circuit comprises only the transistors 1 and 2 and the respective current sources 3 and 4 associated therewith. The change-over switch 7 in this case enables the capacitor 5 to be connected selectively either to the terminal b of the circuit or to the emitter of the transistor 1. In other respects the circuit is identical with that of FIG. 2 and its functions in the same way as the latter. The charge which, when the change-over switches 7, 8, 10 are in the position II, is discharged by the capacitor 5 to the input connection A of the amplifier 9 is in this case equal to $C(V_{BE1}-V)$. The charge which is discharged by the capacitor 6 is always $\alpha C(V_{BE1}-V_{BE2})$, but the value of the coefficient $\alpha$ differs from that of the corresponding coefficient in the case of the first embodiment.

It can also be ascertained from what has already been stated that it is not necessary for the voltages $V_{BE1}$ and $V_{BE2}$ to be produced simultaneously. It is accordingly possible to provide only one bipolar transistor and to arrange for it to be traversed successively by two different currents. This makes it possible to eliminate the problem of the voltage shift between the transistors 1 and 2. This third embodiment is illustrated in FIG. 4 in which the elements which are the same as corresponding elements in FIG. 3 are indicated by the same references.

Figure 4:
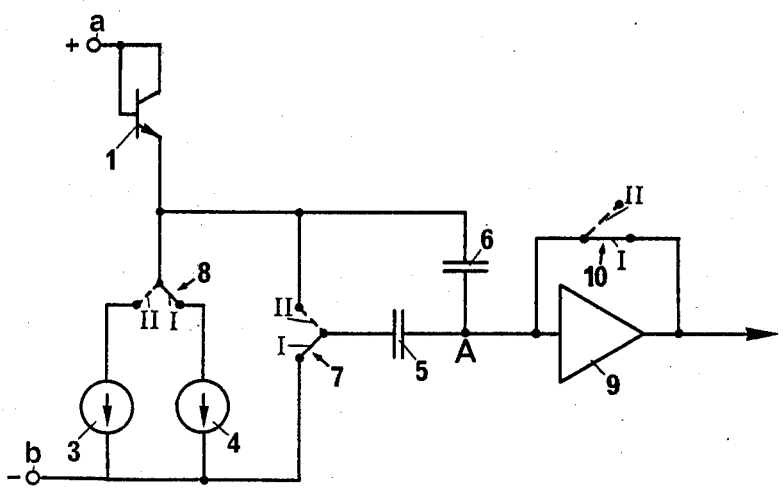
FIG. 4 is a diagram illustrating a variant of the embodiment of FIG. 3 which makes possible the use of one bipolar transistor.

Apart from the fact that there is only one bipolar transistor 1 in FIG. 4, the only difference between the circuit of FIG. 4 and that of FIG. 3 is that the change-over switch 8 in FIG. 4 is interposed between the emitter of the transistor 1 and the two current sources 3 and 4. This circuit operates in the same manner as that of FIG. 3, except for the fact that, during the first phase of operation of the circuit, in the course of which the charging of the capacitors 5, 6 and the biasing of the amplifier take place, the base-emitter junction of the transistor 1 is traversed by the current $I_2$. The voltage $V_{BE2}$ in this case is therefore the base-emitter voltage of the transistor 1 which is traversed by the current $I_2$. During the second phase, this same junction is traversed by the current $I_1$.

The three preceding illustrative circuits enable an input voltage to be compared with a reference level equal to the bandgap value $V_{BG}$.

Figure 5:
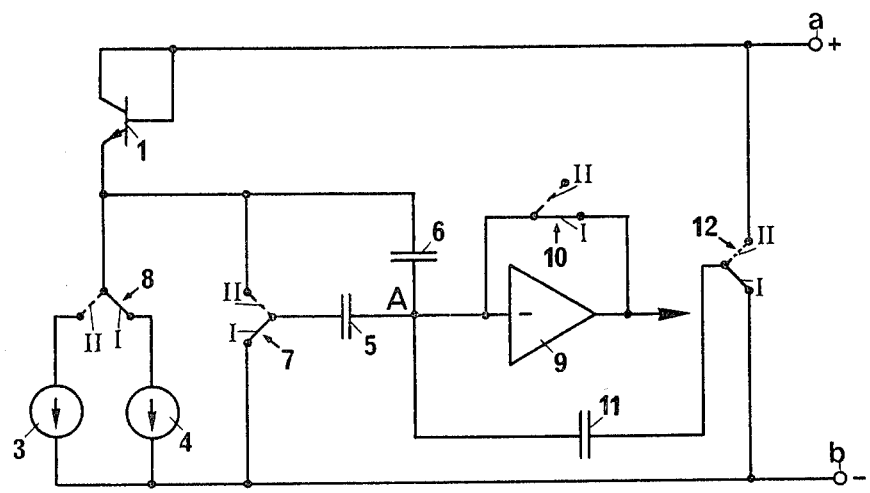
FIG. 5 is a diagram of an illustrative embodiment in which the detecting circuit includes means for adjusting the voltage reference level.

FIG. 5 illustrates an embodiment of the circuit according to the invention which enables a voltage to be compared with a reference level the value of which is different from the value $V_{BG}$. In addition to the circuit elements which are also present in the circuit of FIG. 4, the circuit shown in FIG. 5 has, for adjusting the value of the reference level, a third capacitor 11 one of the plates of which is connected to the input of the amplifier 9 and the other plate of which can be connected, by means of a change-over switch 12 to one or other of the terminals a, b between which the input voltage is applied.

It can be shown by a quick calculation that, if it is desired to obtain a reference level equal to $zV_{BG}$, where z is a positive number greater or less than 1, the value of the capacitance of the capacitor 11 should be chosen so as to be substantially equal to $|1-z|C/z$, where C always indicates the capacitance of the capacitor 5 and that of the capacitor 6 remains equal to $\alpha C$.

In order to compare a voltage with a reference level below the value $V_{BG}$, the capacitor 11 is connected first to the terminal b and then to the terminal a, the change over of the switch 12 from its position I, shown in full lines in FIG. 5, to its position II, shown in broken lines, bringing about simultaneously the change over of the three other change-over switches 7, 8, 10 of the circuit from their position I to their position II. If, on the contrary, it is desired to compare the voltage V with a reference level above $V_{BG}$, the capacitor 11 is connected first to the terminal a and then to the terminal b.

In both cases, the total charge discharged by the capacitors 5, 6 to the connection A will be zero and there will be no signal at the input of the amplifier 9 if the voltage V approximates very closely to the value $zV_{BG}$. If, on the contrary, the voltage V is different from the value $zV_{BG}$, there will be produced at the input of the amplifier 9 a signal the polarity of which will differ according to whether the voltage V is greater or less than the said reference value.

In practice, if the input voltage also constitutes the supply voltage of the detector circuit, it is possible to detect voltages falling as low as about 800 mV. In the more general case where the input voltage differs from the supply voltage, any voltage can be detected provided that the supply voltage is above 800 mV.

The circuit according to the invention accordingly makes it possible to work with supply voltages below the bandgap value. This is an important advantage as compared with a detector circuit using a reference voltage generating circuit such as that described in the IEEE Journal article previously referred to which cannot afford this possibility without first being subjected to substantial modifications.

In the four illustrative embodiments that have been described, the change-over switches 7, 8, 10, and 12 are naturally constituted by MOS transistors. Now, these transistors can offer very large resistances when the voltages which they have to switch over are very small. In the case where the supply voltage is very small it is, therefore, desirable to avoid the presence in the circuit of floating change-over switches which are required to switch over voltages which are very much lower than their supply voltages, e.g., of the order of only half the latter. This problem can be obviated for the change-over switch 8 by connecting it between the terminal b of the circuit and the two current sources 3, 4 instead of between these two current sources and the transistor 1, i.e., by providing a field-effect transistor between each current source connected to the emitter of the transistor 1 on the one hand and the terminal b on the other hand, one of the transistors being turned off while the other is turned on.

Moreover, an increase in the resistance of the transistor which constitutes the change-over switch 10 is not very disadvantageous because the only effect of this change is to displace the functioning point of the amplifier 9, corresponding to the balanced voltage $V_E$, along the transfer curve of the amplifier to a zone where the gain remains substantial.

Figure 6:
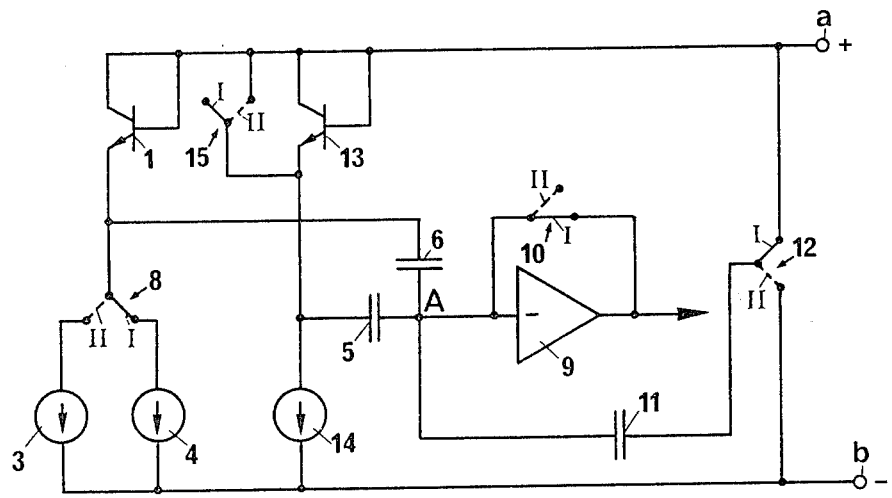
FIG. 6 is a diagram of still another illustrative embodiment which enables the problem of floating change-over switches to be obviated.

In order to solve this problem, so far as the change-over switch 7 is concerned, the solution illustrated in FIG. 6 may be employed.

This circuit once again includes the bipolar transistor 1 which, due to the provision of the change-over switch 8 and the current sources 3, 4, can be traversed successively by the two currents $I_2$ and $I_1$; the amplifier 9 and the change-over switch 10 which makes possible a direct feedback between the output and input of the amplifier during the first phase of operation of the detector circuit and the capacitor 6 connected between the emitter of the transistor 1 and the input of the amplifier. The capacitance of the capacitor 6 has the same value as in the embodiments previously described. The circuit also includes the capacitor 11 one plate of which is connected to the input of the amplifier 9 and the other plate of which can be connected by means of the change-over switch 12 to one or other of the terminals a and b of the circuit between which the input voltage is applied, but the capacitance of this capacitor 11 differs from that in the circuit of FIG. 5.

This circuit comprises in addition a second bipolar transistor 13, which is connected so as to form a diode and is identical to the transistor 1, as well as a current source 14 which maintains the current at the base-emitter junction of this transistor at the value $I_1$. A change-over switch 15 enables that plate of the capacitor 5 which is not connected to the input of the amplifier 9 to be connected selectively either to the emitter of the transistor 13, when the said change-over switch is in the position I or, short-circuiting the transistor 13, to the terminal a when the said change-over switch is in the position II.

The capacitance of the capacitor 11 should be chosen as a function of the desired reference level. If this reference level is $V_{BG}$, the said capacitance should have the same value C as the capacitor 5. If, on the contrary, it is desired to obtain for the detector circuit a reference level which is equal, as in the case of FIG. 5, to $zV_{BG}$, the capacitor should have a capacitance substantially equal to that at C/z. The operation of this circuit is similar to that of the circuits previously described. When the change-over switches 8, 10, 12, 15 are in the position I, the capacitors 5, 6 and 11 will become charged up to the respective voltages $(V-V_{BE1})-V_E$, $(V-V_{BE2})-V_E$ and $V-V_E$, while the amplifier is biased to the working point thereof which corresponds to a maximum gain. When the change-over switches change over simultaneously to their position II, the capacitors 5, 6, 11 will discharge to the connection A charges $CV_{BE1}$, $\alpha C(V_{BE1}-V_{BE2})$ and $-CV/z$. No signal will appear at the input of the amplifier 9 if the algebraic sum of these charges is zero, i.e., if the value of the voltage V is practically equal to the reference level. Otherwise, a change of voltage will appear at the input of the amplifier which will then emit a logic level signal indicating whether the input voltage V is greater or less than the reference level.

The invention is not limited to the embodiments that have been described. In particular, the circuit may be supplied with a voltage which differs from the input voltage. Other modifications of the invention will be apparent to those skilled in the art and it therefore is intended that the scope of the present invention be limited solely by the scope of the appended claims.

What is claimed is:

1. A voltage detecting circuit for comparing an input voltage with a reference level which is associated with the bandgap value of a diode voltage for being substantially independent of temperature, the reference level is defined on the basis of the sum of a first diode voltage and of the product of the difference between a second and a third diode voltage by a predetermined coefficient, comprising:
    a first and a second input terminal between which said input voltage is applied;
    voltage generating means for providing a first, a second and a third voltage the values of which are respectively representative of a first, second and third diode voltage;
    a first capacitive substractive circuit being connected to at least one of said input terminals and to which said first voltage is applied, for producing a first signal representative of the difference between the represented first diode voltage and said input voltage;
    a second capacitive substractive circuit to which said second and said third voltages are applied for producing, in association with the production of the first signal, a second signal representative of the product of the difference between the represented second and third diode voltages by a predetermined coefficient, said first and second signals being applied to a node of the detecting circuit for producing at said node a difference signal representative of the algebraic value of the difference between said input voltage and a reference level; and
    an amplifying circuit having an input connected to said node for bringing said difference signal to a logic level.

2. A circuit according to claim 1, wherein said first substractive circuit comprises a first capacitor of predetermined capacitance having a plate connected to said node of the circuit and another plate which is alternately connected to said input terminal and to said voltage generating means for receiving said first voltage, and wherein said second substractive circuit comprises a second capacitor having a plate connected to said node and another plate to which said second and third voltages are alternately applied, said second capacitor having a capacitance substantially equal to the product of the capacitance of said first capacitor by said predetermined coefficient.

3. A circuit according to claim 1, wherein said voltage generating means comprises three substantially identical bipolar transistors each having its base connected to its collector and each being connected in series with a respective current source.

4. A circuit according to claim 1, comprising means for automatically biasing said amplifying circuit to a stable operating point corresponding to a maximum gain.

5. A circuit according to claim 1, wherein said amplifying circuit is an inverter.

6. A circuit according to claim 1, further comprising a third capacitive substractive circuit for producing a third signal proportional to said input voltage for adding said third signal to said first and second signals.

7. A circuit according to claim 6, wherein said third capacitive substractive circuit comprises a capacitor having a plate connected to said node of the circuit and another plate which is alternately connected to said first and to said second input terminal.

8. A circuit according to claim 1, wherein said input voltage constitutes the supply voltage of the circuit.

9. A voltage detecting circuit for comparing an input voltage with a reference level which is associated with the bandgap value of a diode voltage for being substantially independent of the temperature, the reference level is defined on the basis of the sum of a first diode voltage and of the product of the difference between said first diode voltage and a second diode voltage by a predetermined coefficient, comprising:
    a first and a second input terminal between which said input voltage is applied;
    voltage generating means for providing a first and a second voltage, the values of which are respectively representative of a first and second diode voltage;
    a first capacitive substractive circuit which is connected to at least one of said input terminals and to which said first voltage is applied, for producing a first signal representative of the difference between said first diode voltage and said input voltage;
    a second capacitive substractive circuit to which said first and said second voltage are applied for producing, in association with the production of the first signal, a second signal representative of the product of the difference between said first and said second diode voltage by said predetermined coefficient, said first and second signals being applied to a node of the detecting circuit for producing, at said node, a difference signal representative of the algebraic value of the difference between said input voltage and said reference level; and
    an amplifying circuit having an input connected to said node for bringing said difference signal to a logic level.

10. A circuit according to claim 9, wherein said first substractive circuit comprises a first capacitor of predetermined capacitance having a plate connected to said node of the circuit and another plate which is alternately connected to said input terminal and to said voltage generating means for receiving said first voltage, and wherein said second substractive circuit comprises a second capacitor having a plate connected to said node and another plate to which said first and second voltages are alternately applied, said second capacitor having a capacitance substantially equal to the product of the capacitance of said first capacitor by said predetermined coefficient.

11. A circuit according to claim 9, wherein said voltage generating means comprises two substantially identical bipolar transistors each having its base connected to its collector and each being connected in series with a respective current source.

12. A circuit according to claim 9, wherein said voltage generating means comprises a bipolar transistor having its base connected to its collector and which is alternately connected in series with a first and a second current source.

13. A circuit according to claim 9, comprising means for automatically biasing said amplifying circuit to a stable operating point corresponding to a maximum gain.

14. A circuit according to claim 9, wherein said amplifying circuit is an inverter.

15. A circuit according to claim 9, further comprising a third capactive substractive circuit for producing a signal proportional to said input voltage and for adding this signal to said first and second signals.

16. A circuit according to claim 15, wherein said third substractive circuit comprises a capacitor having a plate connected to said node of the circuit and another plate which is alternately connected to said first and to said second input terminal.

17. A circuit according to claim 9, wherein said input voltage constitute the supply voltage of the circuit.

* * * * *